United States Patent [19]

Bluethgen

[11] 4,438,522

[45] Mar. 20, 1984

[54] METHOD FOR ENCODING ANALOG SIGNALS USING PCM DIFFERENCE CODE WORD FOR FORMING A CODE WORD OF SPECIFIED LENGTH

[75] Inventor: Bjoern Bluethgen, Celle, Fed. Rep. of Germany

[73] Assignee: Polygram GmbH, Fed. Rep. of Germany

[21] Appl. No.: 189,595

[22] Filed: Sep. 22, 1980

[30] Foreign Application Priority Data

Oct. 12, 1979 [DE] Fed. Rep. of Germany ....... 2941452

[51] Int. Cl.³ ............................................. H03K 13/22
[52] U.S. Cl. .............................. 375/27; 340/347 AD; 340/347 M
[58] Field of Search ................. 375/27, 30; 179/15.55; 340/347 AD, 347 DD; 332/11 D

[56] References Cited

U.S. PATENT DOCUMENTS 3,403,226 9/1968 Wintringham ..................... 375/27 X
3,422,227 1/1969 Brown ............................... 179/15.55
3,945,002 3/1976 Duttweiler et al. .......... 340/347 DD

OTHER PUBLICATIONS

Blesser, Digitization of Audio: A Comprehensive Examination of Theory. . . , Journal of the Audio Engineering Society, Oct. 1978, vol. 26, No. 10, pp. 739–771.
Gilchrist, Digital Sound Signals: Tests to Compare the Performance . . . , BBC Research Department Report 1978/26, 8/78; pp. 1–7+3 sheets.

Primary Examiner—T. J. Sloyan
Attorney, Agent, or Firm—Hill, Van Santen, Steadman & Simpson

[57] ABSTRACT

A method for encoding analog signals for storage or transmission purposes, particularly for the digital recording of audio signals in studio devices, samples periodic values of the analog signals and converts the sampled values into pulse-code modulation code words. Successive pulse-code modulation code words are transformed by means of subtraction into pulse-code modulation difference code words and, together with additional auxiliary code elements, form a reference code word having a selected constant length. A reduction of the digital signal flow is achieved as a result of the reference code word, including the auxiliary code elements, being selected shorter than the maximum possible length of a pulse-code modulation difference code word. The generated pulse-code modulation difference code words are continuously monitored as to length, and upon the identification of a difference code word having an excess length, that is, greater than the reference code word, either the excess-length difference code word is abbreviated or is replaced by a pulse-code modulation code word of suitable length.

10 Claims, 16 Drawing Figures

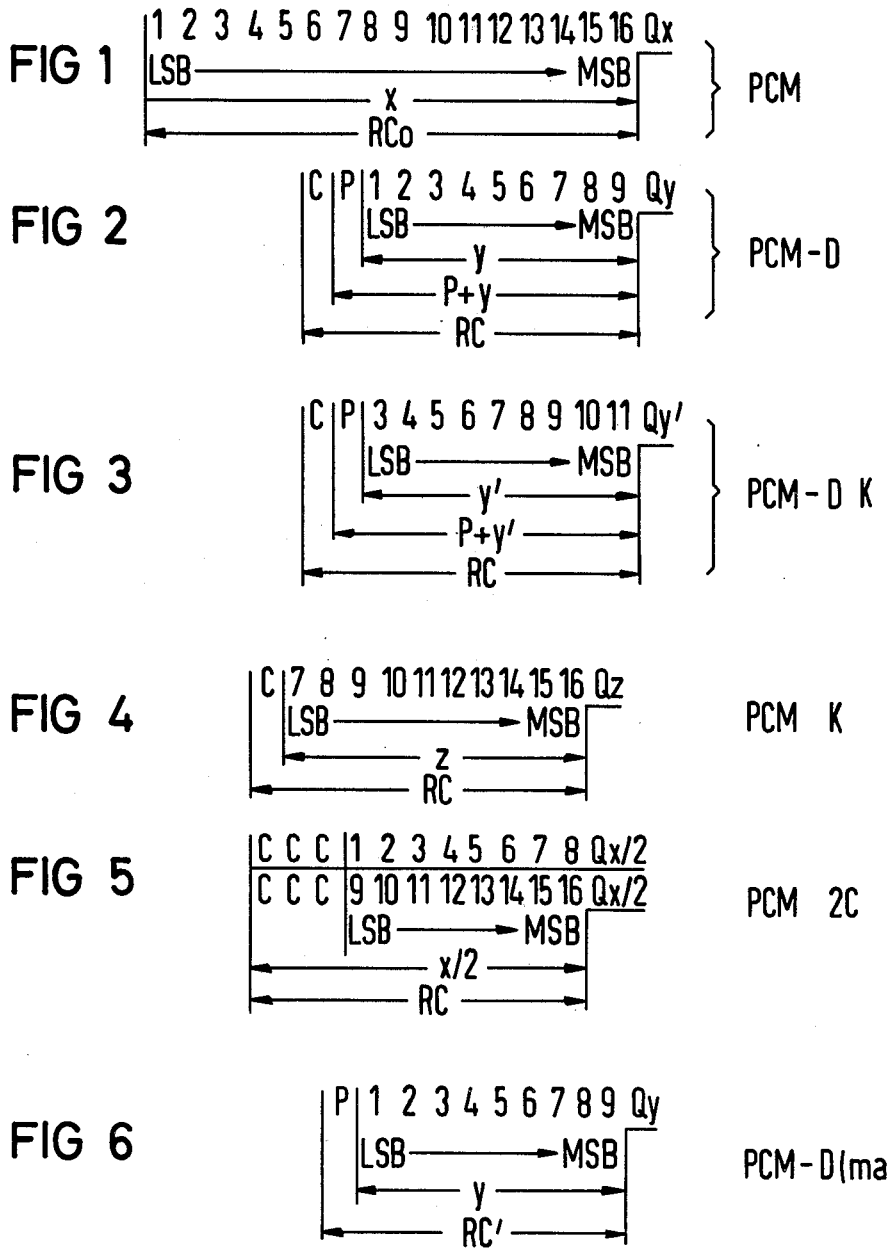

FIG 7

```
1 1 1 1 1 1 1 1 1 1 1 1 1 0    S1
0 1 1 0 0 1 0 1 1 0 0 0 0 0 1   S2
1 0 1 1 1 1 1 1 0 0 0 0 0 0 1   S3
0 1 1 1 1 1 1 1 0 0 0 0 0 0 1   S4
1 1 1 1 0 1 0 1 0 0 0 1 0 0 1   S5
1 0 1 0 1 0 0 1 0 0 0 0 0 0 0   S6
0 0 1 1 1 1 1 1 0 0 0 0 0 0 0   S7
1 0 1 0 1 1 1 1 0 0 0 0 0 0 0   S8
0 1 0 0 1 1 1 1 0 0 0 0 0 0 0   S9
0 0 0 0 0 0 1 0 0 1 0 0 0 0 0   S10
1 1 1 0 0 1 0 1 0 1 0 0 0 0 0   S11
0 1 0 0 1 0 0 1 0 1 0 0 0 0 0   S12
LSB ─────────────────► MSB
                                  ↓ t
```

PCM

FIG 8

```
                +/P 1 1 0 0 1 0 1 1       S1 / S2
                  +/P 1 1 1 0 1 0 1        S2 / S3
                        +/P 1               S3 / S4
         +/P 1 0 0 0 1 1 0 1 0 1 1          S4 / S5
P/L 0 1 0 1 1 0 0 0 0 0 0 1 0 0 0 1         S5 / S6
             +/P 1 1 1 0 0 1 1 0 1          S6 / S7
             P/L 1 1 1 0 0 0 0 0 1          S7 / S8
                          P/L 1 1           S8 / S9
             +/P 0 1 1 1 0 0 1 0 1          S9 / S10
                  +/P 1 1 1 0 0 1 1         S10 / S11
                        P/L 1 0 1 0 1       S11 / S12
LSB ◄─────────────────── MSB
              |◄──── P+y ────►|              ↓ t
```

PCM - D

FIG 9

PCM - D K

```
O/C 1/P 1 1 1 0 0 1 0 1 1       RC1 = y1 + C1 + P1
O/C 1/P 1 1 1 0 1 0 1 0 0       RC2 = y2 + C2 + P2
O/C 1/P 1 0 0 0 0 0 0 0 0       RC3 = y3 + C3 + P3
1/C 1/P 1 0 1 1 0 0 0 0 0       RC4 = y1' + C4 + P4
1/C 0/P 0 0 0 0 1 0 0 0 1       RC5 = y2' + C5 + P5
O/C 1/P 1 1 1 0 0 1 1 0 1       RC6 = y4 + C6 + P6
O/C 0/P 1 1 1 0 0 0 0 0 1       RC7 = y5 + C7 + P7
O/C 0/P 1 1 0 0 0 0 0 0 0       RC8 = y6 + C8 + P8
O/C 1/P 0 1 1 1 0 0 1 0 1       RC9 = y7 + C9 + P9
O/C 1/P 1 1 1 0 0 1 1 0 0       RC10 = y8 + C10 + P10
O/C 0/P 1 0 1 0 1 0 0 0 0       RC11 = y9 + C11 + P11
         LSB ─────► MSB
                                  ↓ t
```

FIG 10

```
1/C     1 1 1 1 1 1 1 0        RC1  = z1 +  C1
O/C 1/P0 1 1 0 0 1 1 1 1        RC2  = y1 +  P1 + C2
O/C 1/P1 1 1 0 1 0 1 0 0        RC3  = y2 +  P2 + C3
O/C 1/P1 0 0 0 0 0 0 0 0        RC4  = y3 +  P3 + C4
1/C     0 1 0 0 0 1 0 0 1       RC5  = z2 +  C5
1/C     0 1 0 0 0 0 0 0 0       RC6  = z3 +  C6
O/C 1/P0 0 1 1 1 1 1 0 1        RC7  = y4 +  C7 + P4
O/C 0/P1 1 1 0 0 0 0 0 1        RC8  = y5 +  C8 + P5
O/C 0/P1 1 0 0 0 0 0 0 0        RC9  = y6 +  C9 + P6
O/C 1/P0 1 1 1 0 0 1 0 1        RC10 = y7 +  C10+ P7
O/C 1/P1 1 1 0 0 1 1 0 0        RC11 = y8 +  C11+ P8
O/C 0/P1 0 1 0 1 0 0 0 0        RC12 = y9 +  C12+ P9
LSB ←——— MSB ↓
```
PCM K

FIG 11

```
1/C0/C0/C1 1 1 1 1 1 1 0        RC1  = x/2_{1a} + C1-3  ⎫ - S1
1/C1/C1/C1 1 1 1 1 1 1 1        RC2  = x/2_{1b} + C4-6  ⎭
O/C1/P    1 1 1 0 0 1 0 1 1     RC3  = y1       + C7 + P1
O/C1/P    1 1 1 0 1 0 1 0 0     RC4  = y2       + C8 + P2
O/C1/P    1 0 0 0 0 0 0 0 0     RC5  = y3       + C9 + P3    PCM 2C
1/C0/C0/C  0 0 0 1 0 0 0 1      RC6  = x/2_{2a} + C10-C12 ⎫ - S5
1/C1/C1/C  1 1 1 0 1 0 1        RC7  = x/2_{2b} + C13-C15 ⎭
1/C0/C0/C  0 0 0 0 0 0 0 0      RC8  = x/2_{3a} + C16-C18 ⎫ - S6
1/C1/C1/C  1 0 1 0 1 0 0 1      RC9  = x/2_{3b} + C19-C21 ⎭
O/C1/P    1 1 1 0 0 1 1 0 1     RC10 = y4       + C22+ P4
O/C0/P    1 1 1 0 0 0 0 0 1     RC11 = y5       + C23+ P5
O/C0/P    1 1 0 0 0 0 0 0 0     RC12 = y6       + C24+ P6
O/C1/P    0 1 1 1 0 0 1 0 1     RC13 = y7       + C25+ P6
O/C1/P    1 1 1 0 0 1 1 0 0     RC14 = y8       + C27+ P7
O/C0/P    1 0 1 0 1 0 0 0 0     RC15 = y9       + C28+ P8
LSB ←——— MSB ↓t
```

FIG 12

```
1/P1 1 1 0 0 1 0 1 1        RC'1  = y1    + P1
1/P1 1 1 0 1 0 1 0 0        RC'2  = y2    + P2
1/P1 0 0 0 0 0 0 0 0        RC'3  = y3    + P3
1/P1 1 1 1 1 1 1 1 1        RC'4  = ymax  + P4
O/P1 1 1 1 1 1 1 1 1        RC'5  = ymax  + P5
1/P1 1 1 0 0 1 1 0 0        RC'6  = y4    + P6        PCM-D_{max}
O/P1 1 1 0 0 0 0 0 1        RC'7  = y5    + P7
O/P1 1 0 0 0 0 0 0 0        RC'8  = y6    + P8
1/P0 1 1 1 0 0 1 0 1        RC'9  = y7    + P9
1/P1 1 1 0 0 1 1 0 0        RC'10 = y8    + P10
O/P1 0 1 0 1 0 0 0 0        RC'11 = y9    + P11
LSB ———→ MSB ↓t
```

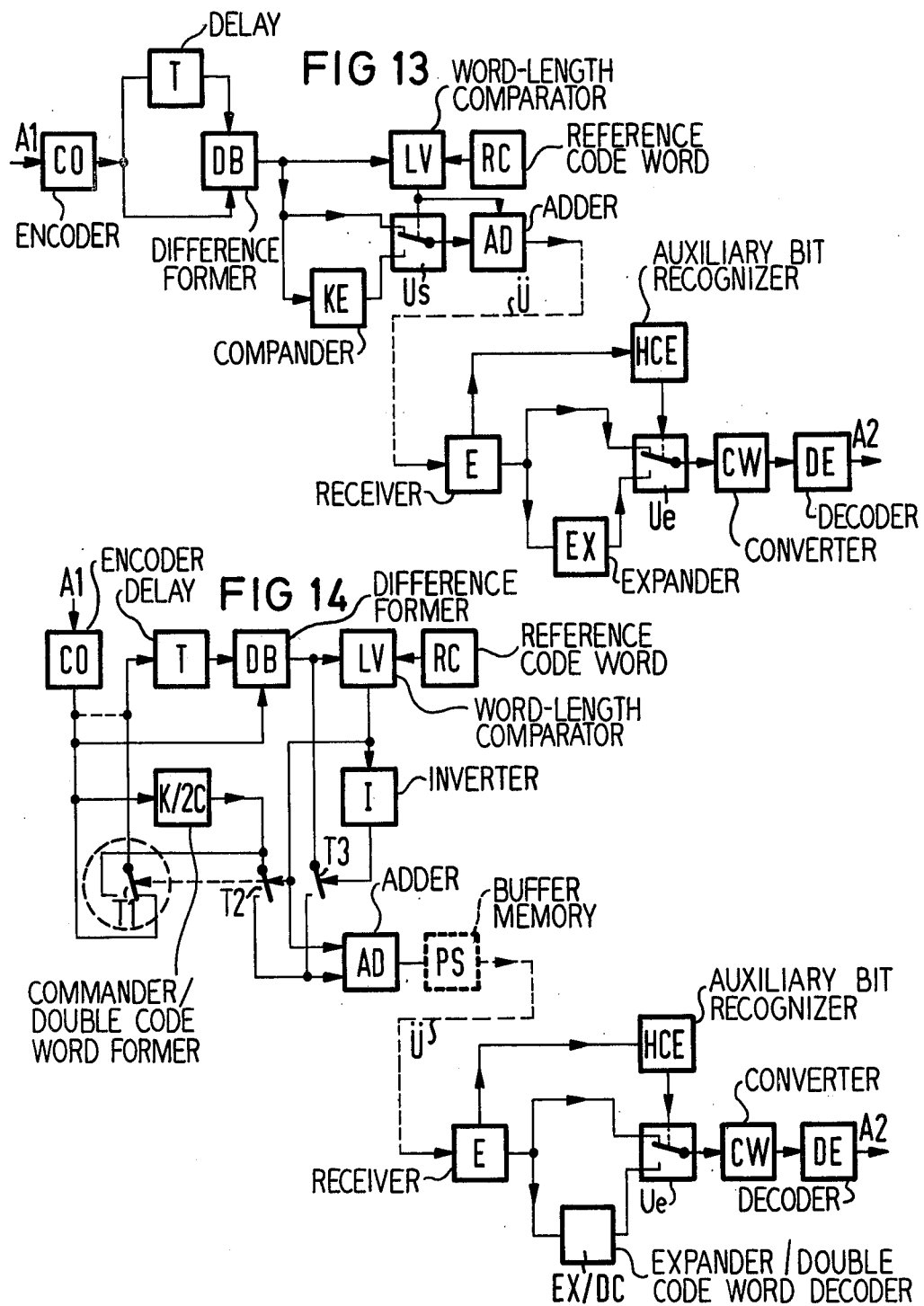

METHOD FOR ENCODING ANALOG SIGNALS USING PCM DIFFERENCE CODE WORD FOR FORMING A CODE WORD OF SPECIFIED LENGTH

BACKGROUND OF THE INVENTION

The present invention relates to a method for encoding analog signals for storage or transmission purposes in which sampled momentary values of an analog signal are converted into pulse-code modulation (PCM) code words in an encoder and PCM difference code words are formed from two successive PCM code words by means of subtraction, and in particular to such a method in which each of the PCM difference code words representing a pulse group, together with at least one additional auxiliary code element, form a code word having a selected constant length, which is designated as a reference code word.

A particularly high accuracy and reliability for the storage or transmission of encoded analog signals can be achieved by the use of uniformly quantized pulse code modulation. In order to reduce the number of elements or bits in the code words, it is known to utilize so-called difference pulse code modulation in which only the amplitude changes of successive momentary values of the analog signal are stored or transmitted in digitally encoded form. Within specified quality parameters, the number of code elements per difference PCM code word is determined by the maximum possible change of the analog amplitude between two successive momentary values of the analog signal. Theoretically, it is possible to reduce the transmission or memory capacity of the system by selecting the number of bits in a code word to be only as large as is required for the representation of the size of the sampled momentary analog value. This, however, requires additional code elements in each code word. During the storage or transmission of code words having differing bit lengths, these additional code elements may be lost due to bit errors, thereby causing distortion and inaccuracy in the recovery of the original analog signal.

As an attempted solution to this problem, it is known to employ PCM redundancy reduction methods which utilize a constant code element amount for the transmission of the momentary signal values, the constant code element amount being reduced in comparison to a maximum value which arises as a result of uniform quantization. The binary encoded momentary values, either individually or in blocks, are transmitted in companded form and are identified by means of corresponding auxiliary code elements. In this solution, however, the quality of the recovered original analog signal is dependent upon the degree of companding, so that the attempted reduction of bit errors occurs at the expense of the introduction of an additional error source.

The theory and practice of the use of so-called difference pulse code modulation is described, for example, in the article "Digitization of Audio: A Comprehensive Examination of Theory, Implementation, and Current Practice", by Barry A. Blesser, Journal of the Audio Engineering Society, October 1978, Volume 26, Number 10, pages 739-771; and in the article "Digital Sound Signals: Tests to Compare the Performance of Five Companding Systems for High-Quality Sound Signals", by N. H. C. Gilchrist, BBC Research Department Report 1978/26, August 1978.

SUMMARY OF THE INVENTION

It is an object of the present invention to provide a method for the transmission or storage of digitally encoded analog signals which for each sampled momentary value fully or optimally guarantees the quality of a uniformly quantized PCM code word even utilizing a reduced constant bit number per code word.

It is a further object of the present invention to provide a simple solution for the frequency limitation encountered in the editting of analog signals for storage or transmission upon the employment of reduced constant bit amounts.

The above objects are inventively achieved by first proceeding from the known method for encoding analog signals in which the sampled momentary values of the analog signals are converted into PCM code words in an encoder and subsequently PCM difference code words are formed from two successive PCM code words by means of subtraction, and in which each of the PCM difference code words representing a pulse group, together with at least one additional auxiliary code element, form a code word with a selected constant length which is designated a reference code word. For achieving the above objects, however, this known method is augmented by selecting the reference code word including the auxiliary code element to be shorter than the maximum possible length of a PCM difference code word, in order to reduce the digital signal flow, and the length of the generated PCM difference code words is continuously compared to the reference code word. Upon the identification of a PCM difference code word exceeding the length of the reference code word, either the difference code word is sufficiently abbreviated by the elimination of a number of the least significant code elements or, the difference code word is replaced by a PCM code word of suitable length.

The invention is based on the perception that the additional momentary value code conversion required for a given bit amount upon the employment of a reduction of the digital signal flow is limited to the large amplitude changes in the analog signal. For analog signals representing voice and music, such large amplitude changes occur infrequently and irregularly, and are distributed among successive sampled momentary values. In other words, the majority of digitally encoded momentary values to be sampled are not covered by the code conversion and no reduction of quality ensues. The quality of the regained original analog signal due to the redundancy reduction of a large amplitude difference between successive momentary values is negligible as a result of the irregular chronological distribution coupled with the infrequent occurrence thereof.

The relatively rare occurrence of a large momentary value difference, even when the reference code word is selected significantly shorter than the maximum possible length of a PCM difference code word, arises due to the fact that the maximum possible value of the amplitude difference between two successive momentary values of the analog signal is frequency dependent upon the fixed sampling. In other words, this maximum value decreases the inverse proportion to the signal frequency. The inventive reduction only occurs when, with reference to an analog signal of constant amplitude and frequency, the quotient deriving from the sampling frequency and the useful signal frequency is greater than or equal to the amplitude relation proceeding from the amplitude difference of two successive momentary values of the analog signal, and is the maximum amplitude value representable in a code word by means of the prescribed code element amount given the prescribed stepping of the quantization. For all signals beneath this limiting value, the quality of the recovered original analog signal corresponds to that of a non-reduced encoded PCM signal.

A particularly high quality standard is achieved when the generation of the PCM code words and the PCM difference code words derived therefrom is based on a uniform quantization.

As used below, the term "abbreviate" means an operation undertaken with respect to an over-long PCM difference code word for generating another code word corresponding to the over-long code word which has a reduced number of binary elements, the reduced number of binary elements being determined by a reference code word. This operation may take the form of operating on the over-long word itself to omit certain binary elements therefrom in order to reduce the length of the code word, or may take the form of replacing the over-long word with a shorter code word.

In a first embodiment of a method for the replacement of an over-long PCM difference code word by the PCM code word most recently generated for gaining the over-long PCM difference code word, the over-long word is abbreviated or companded to the transmittable length prescribed by the reference code words by means of the omission of a corresponding number of the least significant code elements.

Moreover, upon the replacement of one or more over-long PCM difference code words by means of companded PCM code words and subsequent transition to PCM difference code words, it is particularly expedient for the first PCM difference code word to be formed from the difference between the last companded PCM code word and the chronologically directly succeeding PCM code word. By so doing, unavoidable useful signal residual distortion can be significantly reduced.

In a second embodiment of the method by which an over-long PCM code word is abbreviated by replacing the PCM code word most recently used for generating the PCM difference code word, a simultaneous employment of an intermediate storage is utilized which is divided between two successive code words. In this manner, the reconstruction of the original analog signal is achieved with a high degree of accuracy even when the signal converted into the digital level is distorted in the form of bit or code word losses, because each of the PCM words replacing an over-long PCM difference code word can serve as a reference value in the re-conversion process. If, in contrast, such reference values do not exist, the loss of the individual code elements or even of entire code words of the analog signal converted into the digital signal results upon re-conversion in a significant reduction of the signal quality because each of the PCM difference code words relates to the preceding PCM difference code word.

In a third embodiment of the method, the code word replacing the over-long PCM difference code word contains the greatest momentary amplitude difference values which can be represented in the code employed by means of the number of code elements prescribed for the code. In this method, a bit is utilized to signify the polarity of the over-long PCM difference code word to be replaced.

In a further embodiment of the invention, the third embodiment can be employed for achieving the object of frequency-selective amplitude limitation of an analog signal as a function of the amplitude rise velocity by supplying the code words determined as to their length by the reference code word to a code converter for the recovery of the PCM code words from which the original analog signal is then obtained in a decoder in limited form.

DESCRIPTION OF THE DRAWINGS

FIG. 1 is a schematic representation of a PCM code word with uniform quantization.

FIG. 2 is a schematic representation of a PCM difference code word with uniform quantization.

FIG. 3 is a schematic representation of a PCM difference code word with companding.

FIG. 4 is a schematic representation of a PCM code word with companding.

FIG. 5 is a schematic representation of a PCM double code word with uniform quantization.

FIG. 6 is a schematic representation of a PCM difference code word with a limited maximum value.

FIG. 7 is a time grid of a PCM code word sequence comprised of different code words according to FIG. 1.

FIG. 8 is a time grid of the PCM code word sequence of FIG. 7 with the code words converted into PCM difference code words.

FIG. 9 is a time grid of the PCM difference code word sequence of FIG. 8 with companding of over-long PCM difference code words.

FIG. 10 is a time grid of the PCM difference code words of FIG. 8 with a replacement of over-long PCM difference code words by companded PCM code words.

FIG. 11 is a time grid of the PCM difference code word sequence of FIG. 8 with replacement of over-long PCM difference code words by PCM double code words.

FIG. 12 is a time grid of the PCM difference code word sequence of FIG. 8 with replacement of over-long PCM difference code words by PCM difference code words of a maximum value.

FIG. 13 is a schematic block diagram of a transmitter and receiver arrangement for transmission of PCM difference code words with a companding of over-long PCM difference code words.

FIG. 14 is a schematic block diagram of a transmitter and receiver arrangement for the transmission of PCM difference code words in which over-long PCM difference code words are replaced by companded PCM code words or by PCM double code words.

DESCRIPTION OF THE PREFERRED EMBODIMENTS

Figure 15:
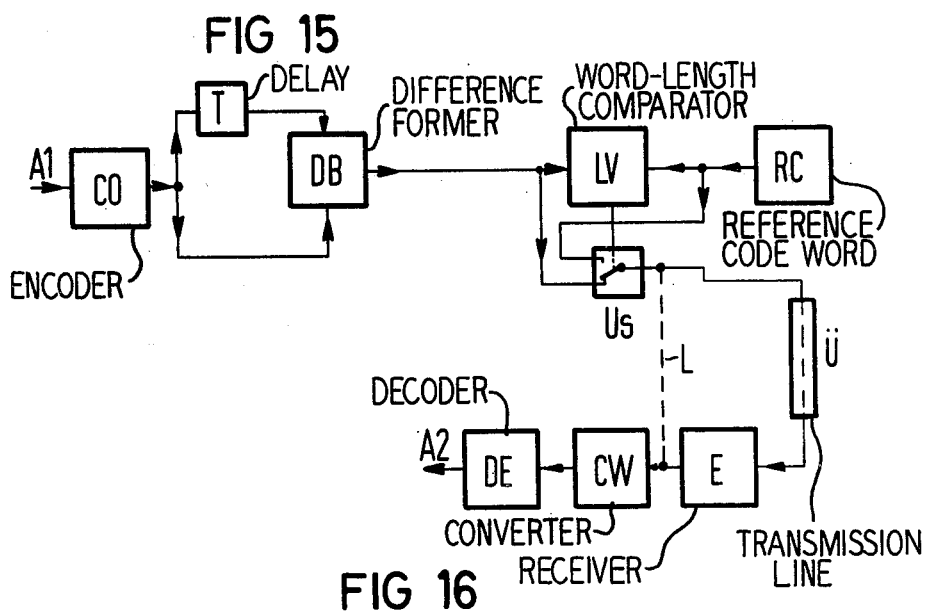
FIG. 15 is a schematic block diagram of a circuit for the frequency-selective limitation of the amplitude of an analog signal as a function of the rate of change of the amplitude.

As shown in the PCM code chart in FIG. 1, a PCM code word of a size x has a code element or bit amount $Q_x$ comprised of elements 1 through 16 with element or bit 1 representing the least significant bit (LSB) and element 16 representing the most significant bit (MSB). The arrow shown in FIG. 1 represents increasing bit significance. The word size x corresponds to the size of the reference code word RC which is the size of each PCM code word representing a sampled value of an analog signal in the signal flow chain.

Upon the subtraction of two successive PCM code words in a known manner to form a PCM difference code word, the code chart PCM-D shown in FIG. 2 arises. In FIG. 2, the reference code word RC is comprised of a word size y with a code element amount Qy comprised of code elements 1 through 9 and two auxiliary code elements, one of which indicates the polarity P, and the other auxiliary code element C signifies the type of coding.

If the word size y as shown in FIG. 2 exceeds the number of nine code elements, such a momentary value is no longer transmittable given the prescribed length of the reference code word RC. In this case, a companding must be employed for transmission of the word. This is illustrated in the code chart PCM-D K of FIG. 3. As shown in FIG. 3, the word size y' contains a code element amount Qy' of nine elements, however, only the code elements 3 through 11 are transmitted, whereas the lowest order code elements 1 and 2 are eliminated as a result of the companding.

Instead of companding an over-long PCM difference code word, one may employ in place of the over-long PCM difference code word the PCM code word most recently generated for deriving the PCM difference code word. The code chart PCM K shown in FIG. 4 indicates such a companded PCM code word in which the word size z having a code element amount Qz exhibits only the ten highest order code elements 7 through 16 according to FIG. 1. The remainder of the code element amount Qz exhibiting eleven code elements overall is formed by the auxiliary code element C indicating the type of code.

The code chart PCM 2C shown in FIG. 5 illustrates the case in which a PCM code word which is employed in place of the over-long PCM difference code word is transmitted in two successive code words each having a word size x/2. Each has a code element amount Qx/2 with the code elements 1 through 8 being accommodated in the first code word of a double word and the code elements 9 through 16 being accommodated in a second code word. The word size x/2 is augmented to the size of the reference code word RC by means of three auxiliary code elements C which, in the particular configuration of FIG. 5, specify the type of code in redundant form. The third of the methods by which an over-long PCM difference code word is replaced by a PCM difference code word with maximum amplitude value is shown in the code chart PCM-D(max) shown in FIG. 6. This method utilizes a reference code word RC' which is smaller by one code element. The maximum amplitude value is represented by the code element amount Qy and an additional code element P representing the polarity of the over-long PCM difference code word which was replaced is added to complete the reference code word RC'. In this case, there is no need for an auxiliary code element C indicating the type of code.

On the basis of FIGS. 7 through 12, the four methods for the reduction of the digital signal flow according to the principles of the present invention are shown in greater detail by utilizing exemplary code word constructed according to the charts shown in FIGS. 1 through 6. A series of twelve PCM code words S1 through S12 constructed according to FIG. 1 are shown on the grid in FIG. 7, with the vertical axis t representing the chronological sequence of the code words.

As shown in the time grid in FIG. 8, PCM difference code words S1/S2, S2/S3 . . . S11/S12 are formed in a known manner from the successive PCM code words S1 through S12 shown in FIG. 7. As shown in FIG. 8, the PCM difference code words S4/S5 and S5/S6 exceed the maximum word size P+y. As FIG. 8 further shows, the auxiliary code elements P are represented by either a "+" or a "−" respectively preceding or following the symbol "P" and separated therefrom by a diagonal. In the additional FIGS. 9 through 11, the polarity is translated to a symbol "1" representing a positive polarity and the symbol "0" representing a negative polarity. The auxiliary code elements C indicating the type of code are similarly represented in FIGS. 9 through 11. FIG. 9 shows the manner in which the time grid of FIG. 8 changes when the over-long PCM difference code words S4/S5 and S5/S6 are subjected to companding in accord with the representation of FIG. 3. The successive reference code words RC1 through RC11 are indicated next to the time grid and are shown to be the sum of word sizes y or y' plus the auxiliary code elements P and C.

In the same manner, FIG. 10 shows a time grid for the case in which the over-long PCM difference code words S4/S5 and S5/S6 according to FIG. 8 are replaced by companded PCM code words in accord with FIG. 4. FIG. 11 shows the case in which the over-long PCM difference code words S4/S5 and S5/S6 shown in FIG. 8 are replaced by unabbreviated PCM code words according to FIG. 5 and are thereby accommodated in two successive code words.

Finally, the time grid shown in FIG. 12 represents the case in which the over-long PCM difference code words S4/S5 and S5/S6 are replaced by PCM difference code words having the maximum representable amplitude value in accord with the representation of FIG. 6.

A transmitter and receiver arrangement which makes use of the reduction of the digital signal flow represented in FIGS. 3 and 9 is shown in block form in FIG. 13. An analog signal A1 to be encoded is supplied to the encoder CO which forms PCM code words with a uniform quantization from the sampled analog values. The PCM code words from the encoder CO are directly supplied to one input of a difference former DB and are supplied to the other input thereof through a delay element T, the time delay of the delay element T being selected to be equal to a PCM code word. The PCM difference code words appearing at the output of the difference former DB are supplied to a length comparator LV which continuously compares the PCM difference code words to a reference code word RC of a permanently prescribed length, the value of which is stored in the element RC. As long as the length comparator LV determines no excess length of the PCM difference code words, the PCM difference code words are supplied from the output of the difference former DB to a transmission line U through a first switch US and through an adder AD. The auxiliary code element indicating the type of coding is supplied from the output of the length comparator LV via the second input of the adder AD. Upon identification of an over-long PCM difference code word, the length comparator LV provides a signal at its output for changing the state of the first switch US to the other switch position, so that the PCM difference code word is now supplied to the adder AD through a compander KE for abbreviation of the PCM difference code word adapted to the reference code word.

At the receiver side, the auxiliary code element forming the code indication is separated from each incoming PCM difference code word by the receiver E and is supplied to an auxiliary bit recognizer HCE. The auxiliary bit recognizer HCE supplies an output which controls a second switch UE at the reception side. As long as no companding is present, the PCM difference code words are supplied from the output of the receiver E through the switch Ue to a converter CW which reconverts the PCM difference code words into PCM code words and supplies the PCM code words to a decoder DE at whose output the regained analog signal A2 appears. Upon recognition of a companded PCM difference code word, the auxiliary bit recognizer HCE supplies a signal for changing the state of the second switch Ue to the other switch position by which the PCM difference code words are now supplied to the code converter CW from the output of the receiver E through an expander EX. The transmission side companding is thereby cancelled in the expander EX.

FIG. 14 illustrates a circuit block diagram corresponding to FIG. 13 for the employment of the reduction of the digital signal flow in accord with FIGS. 4 and 10, or in accord with FIGS. 5 and 11. The generation of the PCM difference code words as well as the comparison thereof to the reference code word in the length comparator LV ensues in the same manner as described above. If the length comparator LV determines the existence of an over-long PCM difference code word, three switches T1, T2 and T3 are actuated. Switches T1 and T2 are directly actuated and the switch T3 is actuated through an inverter I. The switch T2 is normally open and is closed by the appearance of a signal at the output of the comparator LV, while the switch T3 is normally closed and is opened by the presence of that signal. The switch T1 is normally in a first position which transmits the output of the encoder CO to the delay element T. Upon the detection of an over-long PCM difference code word, however, the switch T1 is changed to a second position whereby the PCM code word most recently generated for the difference formation is supplied from the output of the encoder CO through the element K/2C to the adder AD at whose second input the auxiliary code element identifying the type of coding is supplied from the output of the comparator LV. In this case, the element K/2C serves as a compander for implementing the companding in accord with FIGS. 4 and 10.

The companded PCM code word occurring at the output of the compander K/2C is supplied to the input of the delay element T via the switch T1. In this manner, it is guaranteed that, when switching from the companded PCM code word to the PCM difference code word, this PCM difference code word is formed from the difference of the preceding companded PCM code word and the chronologically directly following PCM code word. Upon employment of companded PCM code words, the code words are directly supplied to a transmission line U from the output of the adder AD.

On the reception side, use is made of the same circuit arrangement as shown in FIG. 13. When employing the companding as shown in FIGS. 4 and 10 the element EX/DC on the reception side in FIG. 14 serves as an expander for expanding the companded information.

Upon employment of the reduction of the digital signal flow in accord with FIGS. 5 and 11, the transmission side of FIG. 14 is modified in that the element K/2C now serves as a double code word former, and moreover, a buffer memory PS is post-connected to the adder AD. Moreover, the switch T1 is eliminated as the output of the encoder CO is directly connected to the input of the delay element T, as indicated by the dashed line. The elimination of the switch T1 is indicated by surrounding the switch in a dashed circle as well as indicating the connection from the switch T2 by a dashed line. On the reception side, the circuit element EX/DC serves as a double word decoder for decoding the double code word received from the transmission side.

A circuit arrangement is shown in FIG. 15 for implementation of the reduction of the digital signal flow in accord with FIGS. 6 and 12 and differs on its transmission side from the arrangement of FIG. 13 only in that the first switch Us is used to through-connect the output of the device storing the reference code word RC to the transmission line U as a function of the occurrence of an over-long PCM difference code word as determined in the length comparator LV. The reference code word RC is stored in the memory or other storage device for the maximum amplitude representable thereby, said memory being provided for this purpose. On the reception side, the recovery of the analog signal A2 ensues at the output of the decoder DE via the receiver E and the code converter CW.

Given direct connection of the output of the switch Us to the input of the code converter CW via the dashed line L, the transmission/reception arrangement according to 15 becomes a circuit for the frequency-selective amplitude limitation of an analog signal as a function of the rate of change of its amplitude. Such amplitude limitation is required for the editing of audio program material for storage or for transmission by means of media having a maximum transmission characteristic which is frequency-dependent with respect to the size of the amplitude rate of change.

When recording audio programs on records or magnetic tapes, it is standard practice to keep unavoidable noise to a minimum by boosting the audio signal to be stored or to be transmitted in the range of the higher frequencies of the audio signal. This is known as pre-emphasis. This pre-emphasis results in an overdrive of the level characteristic of the system and non-linear distortions thereby arise which can subsequently no longer be separated from the actual signal. This is because of the higher dynamics of the signal in the range of the boosted frequency component occurring with rapid amplitude rates of change in the audio signal. In order to avoid these undesired overdrives, the audio signals to be stored or transmitted are conducted via limiter circuits which are controlled in a frequency-dependent manner and which require a high technical outlay. Such circuits, however, have the disadvantage that as a result of their delayed transient response they also effect undesired limitations of signal components. This delay transient response can be kept within limits by the use of a multiple frequency band limiter having an overall band width which is subdivided into one third octave frequency bands and whose characteristics can be individually programmed per octave. The outlay for such filter devices is, however, considerable.

The implementation of the required frequency-selective limitation of audio programs upon editing thereof for memory or transmission purposes in the digital level according to the present invention can be implemented with known components of digital technology in a very simple manner without the disruptive influence of undesired transient effects. This is described on the basis of the diagram in FIG. 16.

In sampling an analog signal, for example, an audio signal with an upper limiting frequency fo of 16 kHz with a sampling frequency fs of 32 kHz, a signal component of a predetermined frequency is sampled more frequently during a period as the frequency of the signal component becomes lower. Thus, the maximum possible amplitude difference between two successive samples of an analog signal is proportional to the frequency of the audio signal in a first approximation. Upon length comparison to the reference code word RC, the PCM difference code words occurring at the output of the difference former DB produce over-long difference code words only when rapid amplitude rates of change are encountered in the range of the high frequencies of the audio signal. The required limitation of such an over-long PCM difference code word to the code element number of the reference code word in such a manner that the maximum amplitude value representable given the length of the reference code word takes the place of the over-long PCM difference code word, has the influence on the recovered analog signal A2 at the output of the decoder DE in FIG. 15 of reducing the amplitudes of the signal components in the range of the higher frequencies, in accord with the diagram of FIG. 16.

Figure 16:
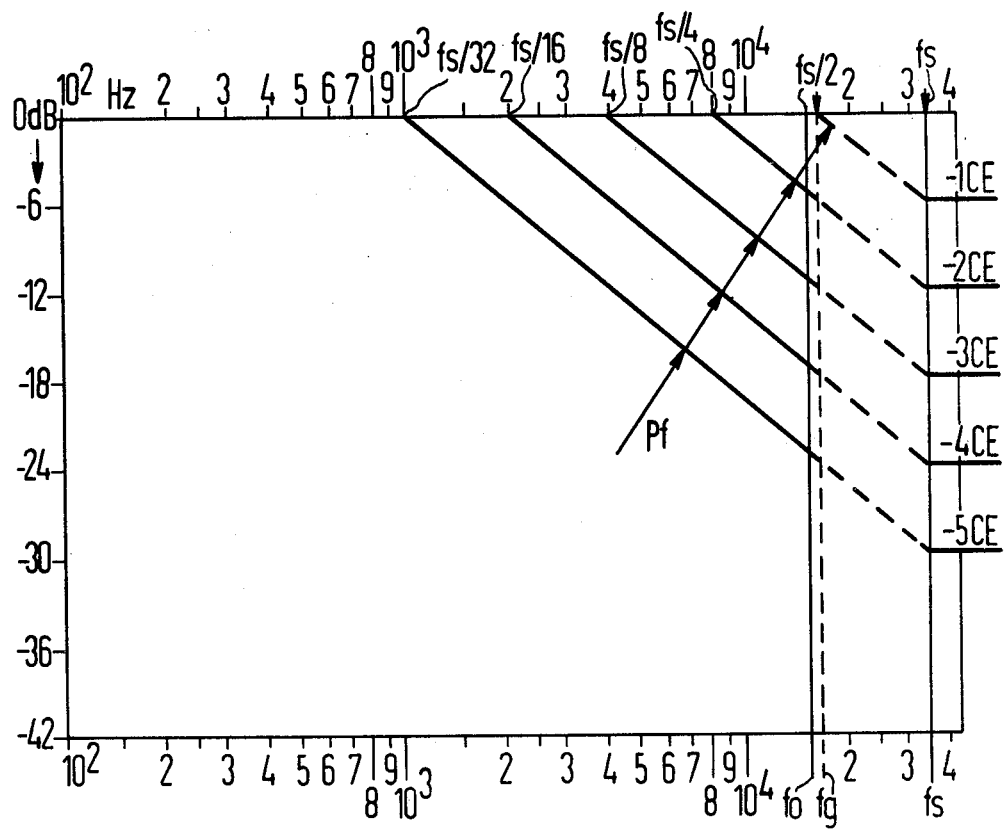
FIG. 16 is a graphic illustration of the manner of functioning of the limiter circuit of FIG. 15.

As shown in FIG. 16, the level reduction, proceeding from the standard level of 0 dB through-42 dB, is indicated over a logarithmic frequency scale from $10^2$ Hz through $4 \times 10^4$ Hz for those cases in which the reduction of the over-long PCM difference code words is undertaken by 1, 2, 3, 4 or 5 code elements CE. The code element reduction is indicated in the diagram of FIG. 16 on the right hand side. This represents the parameter for the curves which are illustrated in the diagram as straight lines decreasing in the direction of higher frequencies. Accordingly, there is still no limitation of the amplitude given reduction by one code element CE of an audio signal given a cutoff frequency fg of the low pass filter limiting the audio signal. Because each omitted code element carries with it a level reduction of 6 dB related to the sampling frequency fs, a reduction of the maximum amplitude to one half of its initial value occurs given a code element reduction by two code elements CE and given the cutoff frequency fg. Amplitudes of sounds whose frequencies are equal to or less than one fourth of the sampling frequency fs are no longer effected because the maximum occurring amplitude difference values in this frequency range are completely representable given the length of the reference code word prescribed, that is, a length which is abbreviated by two code elements in comparison to a reference code word length for a non-reduced transmission. As FIG. 16 shows, given an abbreviation by five code elements CE, a linear attenuation reduction is derived beginning at an audio frequency which corresponds to 1/32 of the sampling frequency fs.

Because generally the boost of the frequencies in the upper range of the audio signal undertaken in the editing of audio programs ensues at 6 dB per octave, the circuit according to 15 represents an ideal limiter whose decreasing characteristics respectively form ranges of constant amplitude rates of change. The multiple arrow line Pf indicated perpendicular to these characteristics indicates the step-wise change of the amplitude rates of change in the direction of decreasing values.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for encoding analog signals for storage and transmission thereof in digital form for reducing the digital signal flow comprising the steps of:
   sampling momentary values of said analog signal;
   converting the sampled momentary values of said analog signal into a series of pulse code modulated code words;
   forming a corresponding series of pulse code modulated difference code words from pairs of successive pulse code modulated code word in said series, the length of each pulse code modulated difference code word together with one auxiliary code element indicating polarity forming a reference code word having a predetermined constant length which is selected to be less than a maximum possible length of a pulse code modulated difference code word;
   constantly comparing the respective lengths of the combination of said pulse code modulated difference code word and said auxiliary code element with the length of said reference code word;
   abbreviating a pulse code modulated difference code word compared with said reference code word when the length of said combination exceeds the length of said reference code word, such that said combination is abbreviated to less than or equal to said reference code word length; and
   adding a second auxiliary code element indicating code form to the abbreviated code word and to the length of said reference code word as required for identifying one of two alternative types of code form.

2. The method of claim 1 wherein the step of abbreviating a pulse code modulated difference code word is further defined by eliminating a number of least significant code elements in said pulse code modulated difference code word.

3. The method of claim 1 wherein said reference code word length includes said second auxiliary code element indicating code form and wherein the step of abbreviating a pulse code modulated difference code word is further defined by replacing the pulse code modulated difference code word having a length which exceeds the length of said reference code word including said second auxiliary code element indicating code form with a replacement pulse code modulated difference code word, the combination of said replacement code word and said second auxiliary code element having a length which is less than or equal to said reference code word length including said second auxiliary code element.

4. The method of claim 1 wherein said pulse code modulated code words and said pulse code modulated difference code words derived therefrom are based on a uniform quantization.

5. The method of claim 3 wherein the pulse code modulated code word which is used to replace the pulse code modulated difference code word having a length which exceeds the length of said reference code word is a pulse code modulated code word which is most recently generated for deriving said pulse code modulated difference code word, and comprising the additional step of companding said pulse code modulated code word replacing the pulse code modulated difference code word to a transmittable length less than or equal to the length of the reference code word by omitting a plurality of least significant code elements in said pulse code modulated code word.

6. The method of claim 5 comprising the additional step of forming subsequent pulse code modulated difference code words, after replacement of a pulse code modulated difference code word by a pulse code modulated code word, by forming the difference of the most recently companded pulse code modulated code word and the chronologically directly following pulse code modulated code word.

7. The method of claim 3 wherein the pulse code modulated code word which is used to replace the pulse code modulated difference code word having a length in excess of the length of said reference code word is the pulse code modulated code word most recently generated for deriving the pulse code modulated difference code word, and comprising the additional step of dividing the pulse code modulated code word replacing the pulse code modulated difference code word into two successive code words of transmittable length.

8. The method of claim 1 wherein at least one auxiliary code element is utilized for identification of the type of coding of the pulse code modulated code word associated therewith.

9. The method of claim 3 wherein said pulse code modulated code word which is used to replace the pulse code modulated difference code word having a length which exceeds the length of said reference code word contains the greatest momentary analog amplitude value which can be represented by the number of code elements in said pulse code modulated code word, and further includes another auxiliary code element indicating the polarity of the pulse code modulated difference code word which is to be replaced.

10. The method of claim 9 wherein said method is utilized for frequency-selective amplitude limitation of an analog signal as a function of the rate of change of the amplitude of the analog signal comprising the additional steps of:
supplying the pulse code modulated difference code word compared with said reference code word to a code converter for recovering the pulse code modulated code words if said pulse code modulated different code word has a length which is less than or equal to the length of said reference code word;
supplying said abbreviated code word to said code converter if the pulse code modulated difference code word compared with said reference code word has a length greater than said reference code word;
supplying the recovered pulse code modulated code words from said converter to a decoder for recovering said analog signal in limited form.

* * * * *